(12) United States Patent
Lin et al.

(10) Patent No.: US 12,237,395 B2
(45) Date of Patent: Feb. 25, 2025

(54) HIGH ELECTRON MOBILITY TRANSISTOR AND METHOD FOR FORMING THE SAME

(71) Applicant: UNITED MICROELECTRONICS CORP., Hsin-Chu (TW)

(72) Inventors: Ko-Wei Lin, Taichung (TW); Chun-Chieh Chiu, Keelung (TW); Chun-Ling Lin, Tainan (TW); Shu Min Huang, Tainan (TW); Hsin-Fu Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 401 days.

(21) Appl. No.: 17/676,216

(22) Filed: Feb. 20, 2022

(65) Prior Publication Data
US 2023/0238445 A1    Jul. 27, 2023

(30) Foreign Application Priority Data

Jan. 24, 2022   (CN) ..................... 202210078217.9

(51) Int. Cl.
| | | |
|---|---|---|
| H01L 29/66 | (2006.01) | |
| H01L 21/324 | (2006.01) | |
| H01L 21/768 | (2006.01) | |
| H01L 29/20 | (2006.01) | |
| H01L 29/778 | (2006.01) | |

(52) U.S. Cl.
CPC .... *H01L 29/66431* (2013.01); *H01L 21/3245* (2013.01); *H01L 21/76841* (2013.01); *H01L 29/2003* (2013.01); *H01L 29/7786* (2013.01)

(58) Field of Classification Search
CPC ........... H01L 29/66431; H01L 29/6646; H01L 29/452; H01L 29/45; H01L 29/454; H01L 29/778–7789; H01L 29/2003; H01L 29/66462; H01L 29/1066; H01L 29/41766; H01L 21/76841; H01L 21/28264; H01L 21/28575
See application file for complete search history.

(56) References Cited

U.S. PATENT DOCUMENTS

| | | | |
|---|---|---|---|
| 7,105,868 B2 | 9/2006 | Nause | |
| 2011/0140173 A1* | 6/2011 | Ramdani | H01L 29/452 257/E29.166 |
| 2017/0077255 A1 | 3/2017 | Yao | |
| 2020/0083167 A1* | 3/2020 | LaRoche | H01L 29/475 |
| 2022/0148938 A1* | 5/2022 | Lin | H01L 23/3192 |

* cited by examiner

*Primary Examiner* — Shahed Ahmed
*Assistant Examiner* — Rhys Poniente Sheker
(74) *Attorney, Agent, or Firm* — Winston Hsu

(57) ABSTRACT

A high electron mobility transistor (HEMT) includes a substrate, a channel layer, a barrier layer and a passivation layer. A contact structure is disposed on the passivation layer and extends through the passivation layer and the barrier layer to directly contact the channel layer. The contact structure includes a metal layer, and the metal layer includes a metal material doped with a first additive. A weight percentage of the first additive in the metal layer is between 0% and 2%.

18 Claims, 6 Drawing Sheets

HIGH ELECTRON MOBILITY TRANSISTOR AND METHOD FOR FORMING THE SAME

BACKGROUND OF THE INVENTION

1. Field of the Invention

The present invention relates to semiconductor technology. More particularly, the present invention relates to a high electron mobility transistor and a method for forming the same.

2. Description of the Prior Art

A high electron mobility transistor (HEMT) is a new type of field effect transistor which usually includes a heterostructure formed by stacking multiple semiconductor layers. By selecting materials of the semiconductor layers, a two-dimensional electron gas (2 DEG) layer may be formed at a heterojunction of the heterostructure formed by bonding two semiconductor layers having different band gaps. The two-dimensional electron gas layer may be utilized as a current channel of the high electron mobility transistor, and is able to provide a high switching speed and a high response frequency of the high electron mobility transistor. HEMTs have been widely used in technical fields such as power converters, low noise amplifiers, radio frequency (RF) or millimeter wave (MMW). Numerous efforts have been made to optimize the performance of HEMTs to fulfill the increasing demands for higher voltage, higher frequency and lower power consumption. How to reduce the contact resistance and increase the power efficiency are important subjects in this field.

SUMMARY OF THE INVENTION

In light of the above, the present invention is directed to provide a high electron mobility transistor and a method for forming the same, which includes a contact structure including a liner and a metal layer that is on the liner and includes a metal material and an additive doped in the metal material. The additive may diffuse to the interface between the metal layer and the liner of the contact structure and react with the liner. Therefore, the reaction of the metal material and the liner that may produce high resistance product and increase the resistance of the contact structure may be suppressed.

One aspect of the present invention provides a high electron mobility transistor including a channel layer disposed on a substrate, a barrier layer disposed on the channel layer, a passivation layer disposed on the barrier layer, and a contact structure disposed on the passivation layer and extending through the passivation layer and the barrier layer to direct contact the channel layer, wherein the contact structure comprises a liner and a metal layer disposed on the liner, and the metal layer comprises a metal material doped with a first additive, and a weight percentage of the first additive in the metal layer is between 0% and 2%.

Another aspect of the present invention provides a method for forming a high electron mobility transistor including the steps of forming a channel layer on a substrate, forming a barrier layer on the channel layer, forming a passivation layer on the barrier layer, forming an opening through the passivation and the barrier layer to expose a portion of the channel layer, forming a liner along a bottom surface and sidewalls of the opening, and forming a metal layer on the liner, wherein the metal layer comprises a metal material doped with a first additive, and a weight percentage of the first additive in the metal layer is between 0% and 2%.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
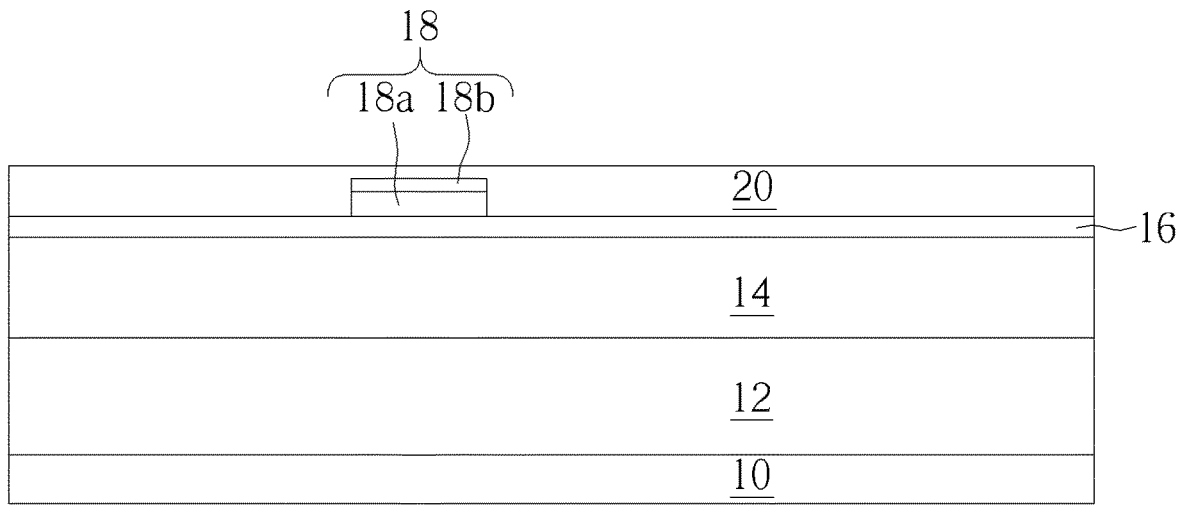
FIG. 1 to FIG. 4 are schematic cross-sectional views illustrating a method for forming a high electron mobility transistor according to an embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. Relative dimensions and proportions of parts of the drawings have been shown exaggerated or reduced in size, for the sake of clarity and convenience in the drawings. The same reference signs are generally used to refer to corresponding or similar features in modified and different embodiments. These embodiments are described in sufficient detail to enable those skilled in the art to practice the invention. Other embodiments may be utilized and that structural, logical and electrical changes may be made without departing from the spirit and scope of the present invention.

The high electron mobility transistor provided by the present invention may be depletion mode (normally-on) high electron mobility transistors or enhancement mode (normally-off) high electron mobility transistors. The high electron mobility transistors provided by the present invention may be used in power converters, low noise amplifiers, radio frequency (RF) or millimeter wave (MMW) and other technical fields.

The types and shapes of the gate structures, the drain structures, and the source structures of the high electron mobility transistors described in the embodiments of the present invention are only examples for the purpose of convenience of drawing and description, and are not used to limit the scope of the present invention. Moreover, in the following embodiments, high electron mobility transistors including metal-semiconductor gate structures are taken as examples to illustrate the principle of the present invention. It should be understood that the present invention may also be applied to high electron mobility transistors including metal gate structures.

FIG. 1 to FIG. 4 are schematic cross-sectional views illustrating a method for forming a high electron mobility transistor according to an embodiment of the present invention. Please refer to FIG. 1. First, a substrate 10 is provided.

A stack structure is formed on the substrate 10. The stack structure may include, in a sequence from bottom to top, a buffer layer 12, a channel layer 14, a barrier layer 16, a gate structure 18, and a passivation layer 20. According to an embodiment of the present invention, the gate structure 18 may be a metal-semiconductor gate structure that includes a semiconductor gate layer 18a and a metal gate layer 18b. The method for forming the stack structure may include performing a series of deposition processes to form the buffer layer 12, the channel layer 14, the barrier layer 16, the semiconductor gate layer 18a and the metal gate layer 18b on the substrate 10. Subsequently, a patterning process may be performed to etch and remove unnecessary portions of the semiconductor gate layer 18a and the metal gate layer 18b to form the gate structure 18. After that, another deposition process may be performed to form the passivation layer 20 on the barrier layer 16 and the gate structure 18, so that the stack shown in FIG. 1 may be obtained. According to an embodiment of the present invention, the deposition processes used to form the layers of the stack structure shown in FIG. 1 may include molecule beam epitaxy (MBE) process, hydride vapor phase deposition (HVPE) process, metal-organic chemical vapor deposition (MOCVD) process, chemical vapor deposition (CVD) process, atomic layer deposition (ALD) process, physical vapor deposition (PVD) process, molecular beam deposition (MBD) process, plasma-enhanced chemical vapor deposition (PECVD) process, but are not limited thereto.

The substrate 10 may be a silicon substrate, a silicon carbide (SiC) substrate, a sapphire substrate, a gallium nitride (GaN) substrate, an aluminum nitride (AlN) substrate, or a substrate made of other suitable materials, but is not limited thereto. The buffer layer 12, the channel layer 14, and the barrier layer 16 may respectively include a single layer or a multilayer structure. The buffer layer 12, the channel layer 14, and the barrier layer 16 may respectively include a III-V compound semiconductor material, such as gallium nitride (GaN), aluminum gallium nitride (AlGaN), graded aluminum gallium nitride (graded AlGaN), aluminum indium nitride (AlInN), indium gallium nitride (InGaN), aluminum gallium indium nitride (AlGaInN), doped gallium nitride (doped GaN), aluminum nitride (AlN), or a combination thereof, but is not limited thereto. According to an embodiment of the present invention, the buffer layer 12 includes aluminum gallium nitride (AlGaN), the channel layer 14 includes allium nitride (GaN), and the barrier layer 16 includes aluminum gallium nitride (AlGaN). A two-dimensional electron gas (2 DEG) layer may be formed at the junction between the barrier layer 16 and the channel layer 14 and be utilized as a planar current channel of the high electron mobility transistor.

The gate structure 18 controls the conducting or cut-off of the two-dimensional electron gas layer. The semiconductor gate layer 18a of the gate structure 18 may include an n-type doped III-V compound semiconductor material, an n-type doped II-VI compound semiconductor material, an undoped III-V compound semiconductor material, an undoped II-VI compound semiconductor material, a p-type doped III-V compound semiconductor material, or a p-type doped II-VI compound semiconductor material, but is not limited thereto. According to an embodiment of the present invention, the semiconductor gate layer 18a of the gate structure 18 includes p-type gallium nitride (p-GaN) that includes dopants such as magnesium (Mg), iron (Fe), or other suitable p-type dopants. The metal gate layer 18b of the gate structure 18 may include a metal material, such as gold (Au), tungsten (W), cobalt (Co), nickel (Ni), titanium (Ti), molybdenum (Mo), copper (Cu), aluminum (Al), tantalum (Ta), palladium (Pd), platinum (Pt), compounds (such as nitrides, silicides or oxides) of the above materials, a composite layer of the above materials, or an alloy of the above materials, but is not limited thereto. According to an embodiment of the present invention, the metal gate layer 18b of the gate structure 18 includes titanium nitride (TiN). The metal-semiconductor interface between the semiconductor gate layer 18a and the metal gate layer 18b is preferably a Schottky contact which may enable a rectification function for the gate structure 18.

The passivation layer 20 covers the stack structure and may serve as an isolation and passivation layer for the stack structure. The passivation layer 20 may include a dielectric material, such as silicon oxide ($SiO_2$), silicon nitride (SiN), silicon oxynitride (SiON), aluminum oxide ($Al_2O_3$), aluminum nitride (AlN), boron nitride (BN), zirconia ($ZrO_2$), hafnium oxide ($HfO_2$), lanthanum oxide ($La_2O_3$), lutetium oxide ($Lu_2O_3$), lanthanum oxide ($LaLuO_3$), high-k dielectric materials, organic polymers such as polyimide (PI), benzocyclobutene (BCB), polybenzoxazole (PBO), or a combination thereof, but is not limited thereto. According to an embodiment of the present invention, the passivation layer 20 includes silicon nitride (SiN).

Figure 2:
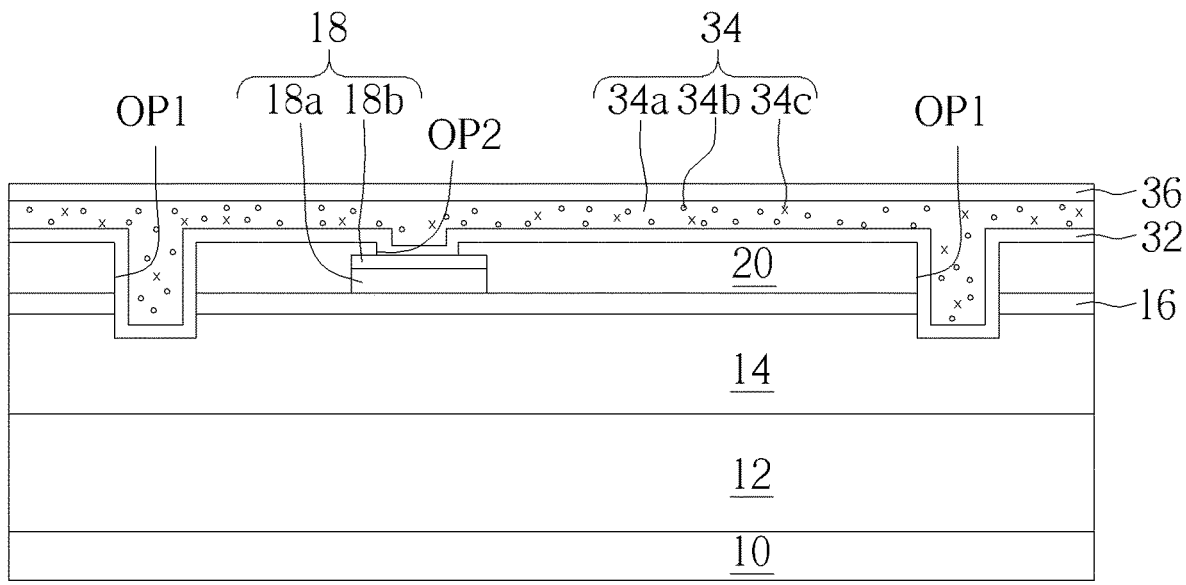

Please refer to FIG. 2. Subsequently, an etching process may be performed to etch the stack structure to form the openings OP1 at two sides of the gate structure 18 and the opening OP2 directly on the gate structure 18. The openings OP1 respectively extend through the passivation layer 20 and the barrier layer 16 to expose a portion of the channel layer 14. The opening OP2 extends through the passivation layer 20 directly on the gate structure 18 to expose a portion of the metal gate layer 18b. After that, a series of deposition processes or suitable film forming processes may be performed to sequentially form a liner 32, a metal layer 34 and a cap layer 36 on the passivation layer 20 of the stack structure and filling the openings OP1 and OP2. As shown in FIG. 2, the liner 32 conformally covers the surface of the passivation layer 20 and the sidewalls and bottom surfaces of the openings OP1 and OP2. The portions of the liner 32 in the bottom portions of the openings OP1 are in direct contact with the barrier layer 16 and the channel layer 14. The portion of the liner 32 in the bottom portion of the opening OP2 is in direct contact with the metal gate layer 18b of the gate structure 18. The liner 32, the metal layer 34 and the cap layer 36 may respectively include a metal material, such as gold (Au), tungsten (W), cobalt (Co), nickel (Ni), titanium (Ti), molybdenum (Mo), copper (Cu), aluminum (Al), tantalum (Ta), palladium (Pd), platinum (Pt), compounds of the above materials, a composite layer of the above materials, or an alloy of the above materials, but is not limited thereto. The thicknesses of the liner 32, the metal layer 34, and the cap layer 36 may be adjusted according to device needs. According to an embodiment of the present invention, the thickness of the liner 32 may be between 10 and 200 angstroms, the thickness of the metal layer 34 may be between 1000 and 3000 angstroms, and the thickness of the cap layer 36 may be 250 and 350 angstroms, but is not limited thereto.

Figure 3:
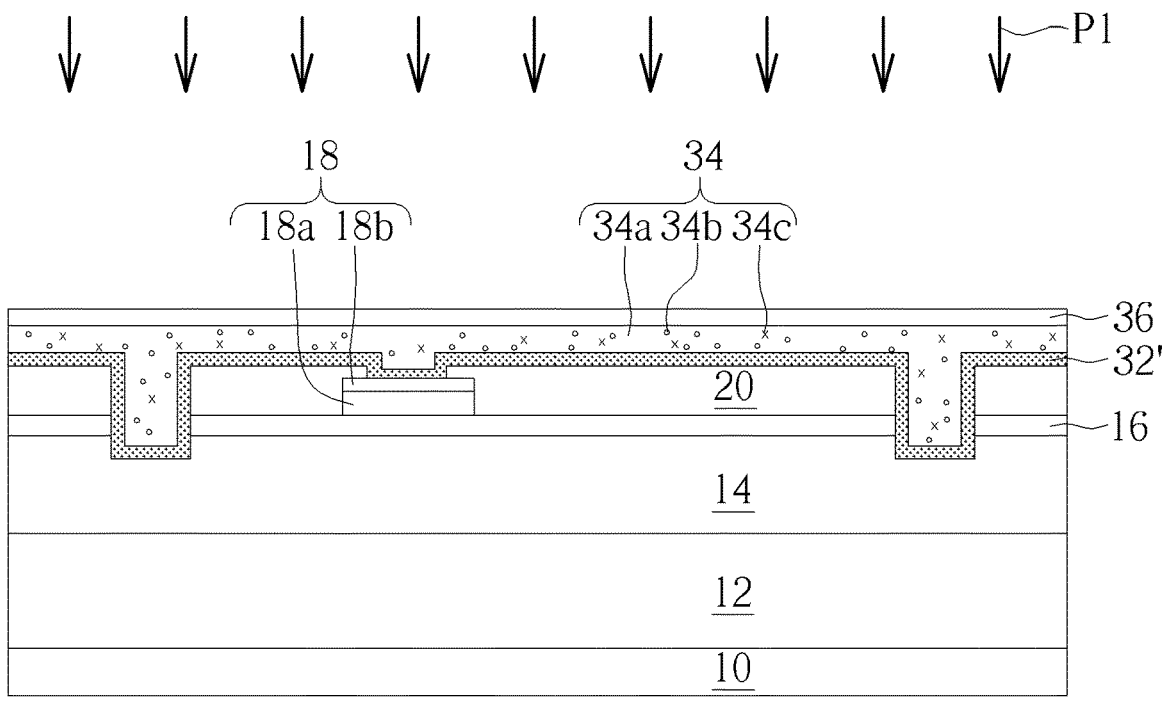

The materials of the liner 32 and the metal layer 34 are selected based on the material of the channel layer 14, and are able to form an ohmic contact with the channel layer 14 after a thermal process (for example, after the anneal process P1 shown in FIG. 3). Furthermore, the metal layer 34 may include at least an additive additionally added to the metal material of the metal layer 34 to improve the quality of the ohmic contact and also improve the conductivity and reliability of the metal layer 34. According to an embodiment of the present invention, for a channel layer 14 made of gallium nitride (GaN), the liner layer 32 may preferably include titanium (Ti) and the metal layer 34 may preferably include aluminum (Al) doped with at least an additive selected from silicon (Si), germanium (Ge), carbon (C), and copper (Cu). According to an embodiment of the present invention, the metal layer 34 may include AlSiCu, AlGeCu, and/or AlCCu, wherein the metal material 34a that constructs the majority of the metal layer 34 is aluminum (Al), the first additive 34b doped in the metal material 34a may include at least one of silicon (Si), germanium (Ge) and carbon (C), and the second additive 34c doped in the metal material 34a may include copper (Cu). According to an embodiment of the present invention, a weight percentage of the first additive 34b (such as Si, Ge, and/or C) in the metal layer 34 may be between 0% and 2%. A weight percentage of the second additive 34c (such as Cu) in the metal layer 34 may be between 0% and 1%. According to an embodiment of the present invention, the weight percentage of the first additive 34b may be equal to or larger than the weight percentage of the second additive 34c. The metal layer 34 may be formed by any suitable film forming process, such as electron beam evaporation process or sputtering process. In some embodiments, the metal layer 34 may be formed by using a target of the metal material 34a that is already doped with the first additive 34b and the second additive 34c in appropriate concentrations (such as an Al target that is doped with suitable amounts of Si, Ge and/or Ge, and Cu). In other embodiments, other suitable methods may be used to add the first additive 34b and the second additive 34c into the metal material 34a of the metal layer 34, such as multi-target sputtering, but is not limited thereto. The cap layer 36 may provide protection to the metal layer 34 and prevent the surface of the metal layer 34 from oxidation or reaction with other layers. According to an embodiment of the present invention, the cap layer 36 may include titanium nitride (TiN), but is not limited thereto.

Please refer to FIG. 3. Subsequently, an anneal process P1 is performed to react the material of the channel layer 14 with the material of the liner 32, thereby forming an ohmic contact between the channel layer 14 and the metal layer 34 at the bottom portion of each of the openings OP1, and concurrently converting the liner 32 into a metal compound layer 32' by reacting the liner 32 with the first additive 34b of the metal layer 34. According to an embodiment of the present invention, the anneal process P1 may be performed at a temperature between 450° C. and 900° C. and a process time between 5 and 60 minutes, but is not limited thereto. The metal compound layer 32' may include at least the material of the liner 32 and the first additive 34b of the metal layer 34.

Figure 4:
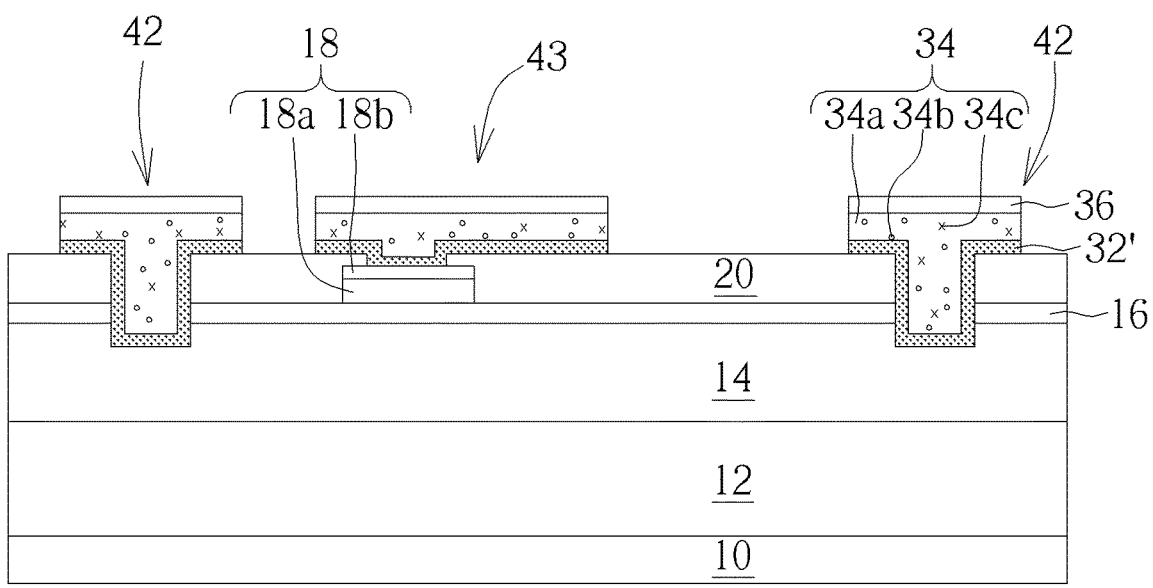

Please refer to FIG. 4. After the anneal process P1, a patterning process may be performed to remove the unnecessary portions of the cap layer 36, the metal layer 34, and the metal compound layer 32', thereby forming contact structures 42 corresponding to the openings OP1 and a contact structure 43 corresponding to the opening OP2. The contact structures 42 (source/drain contacts) are located at two sides of the gate structure 18 and respectively extend through the passivation layer 20 and the barrier layer 16 to directly contact a portion of the channel layer 14. The contact structure 43 (gate contact) is located on the gate structure 18 and extends through the passivation layer 20 directly on the gate structure 18 to directly contact a portion of the metal gate layer 18b of the gate structure 18.

As previously illustrated, when the channel layer 14 is made of gallium nitride (GaN), selecting the liner layer 32 including titanium (Ti) and the metal layer 34 including aluminum (Al) with at least an additive of silicon (Si), germanium (Ge), carbon (C), and/or copper (Cu) may produce an ohmic contact with improved quality and lower contact resistance between the contact structure 42 and the channel layer 14. It is because that, during the anneal process P1 the titanium (Ti) of the liner 32 may capture and react with the nitrogen (N) of the channel layer 14 to form titanium nitride (TiN) and therefore produce a plenty of nitrogen vacancies (N-vacancies) in the channel layer 14. The low work function (3.7 eV) of titanium nitride (TiN) and the heavy n-type doping effect produced by the plenty of nitrogen vacancies in the channel layer 14 are both advantageous to form an ohmic contact with a lower contact resistance. Furthermore, during the anneal process P1 the first additive 34b (such as Si, Ge and/or C) of the metal layer 34 may diffuse toward the interface between the metal layer 34 and the liner 32 and react with the titanium (Ti) of the liner 32, so that titanium aluminide (TiAl$_3$) formed by reaction of the aluminum (Al) of the metal layer 34 and the titanium (Ti) of the liner 32 may be suppressed, and the high resistance problems caused by titanium aluminide (TiAl$_3$) may be prevented. Additionally, the metal compound layer 32' (formed from the liner 32 and the first additive 34b) may include titanium silicide (TiSi), titanium germanium (TiGe), and/or titanium carbide (TiC), which are also low work function materials and are beneficial for the formation of a low resistance ohmic contact. Benefiting from the above factors, the contact resistance of the contact structures 42 provided by the present invention may be reduced. It is noteworthy that the portion of the metal compound layer 32' at the bottom of the openings OP1 may further include titanium nitride (TiN) formed by the reaction of the titanium of the liner layer 32 and the nitrogen of the channel layer 14.

It is one feature of the present invention that by using a metal layer 34 made of AlSiCu, AlGeCu, and/or AlCCu to form the contact structures 42 and the contact structure 43, the titanium aluminide (TiAl$_3$) formed by reaction of the aluminum (Al) of the metal layer 34 and the titanium (Ti) of the liner 32 may be suppressed, and the high contact resistance problems caused by titanium aluminide (TiAl$_3$) may be resolved. Furthermore, the metal compound layer 32' may serve as a diffusion barrier to prevent diffusion of the gallium (Ga) of the channel layer 14 into the metal layer 34 which may result in gallium vacancies (Ga-vacancies) in the gallium nitride (GaN) of the channel layer 14. Overall, the present invention may effectively reduce the contact resistances of the contact structures 42 and the contact structure 43 and achieve a better contact quality.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
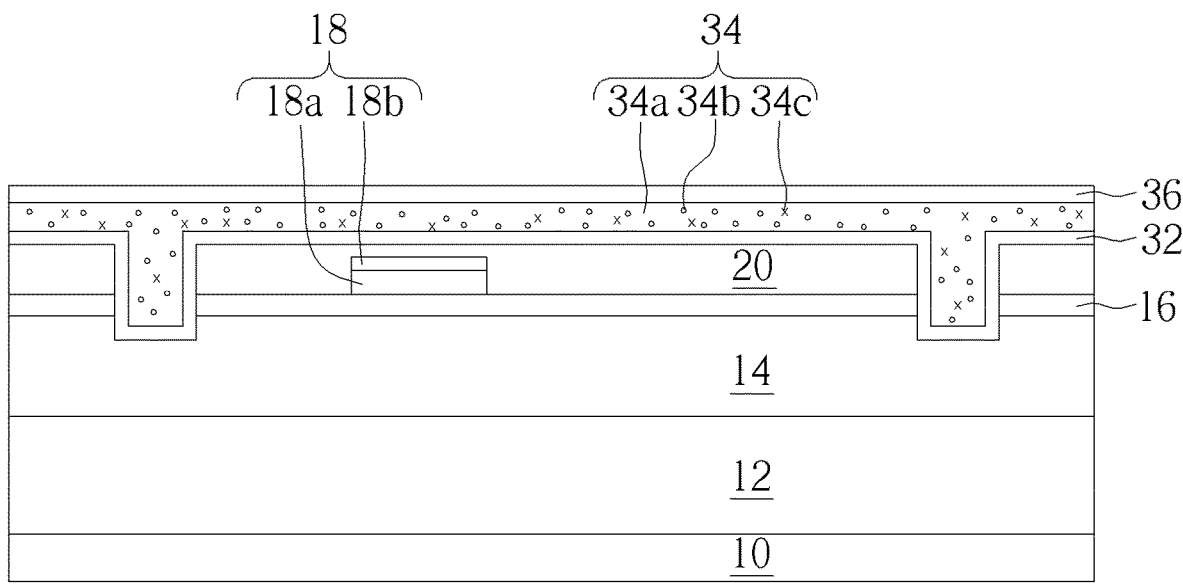
FIG. 5 to FIG. 8 are schematic cross-sectional views illustrating a method for forming a high electron mobility transistor according to another embodiment of the present invention.
Figure 6:
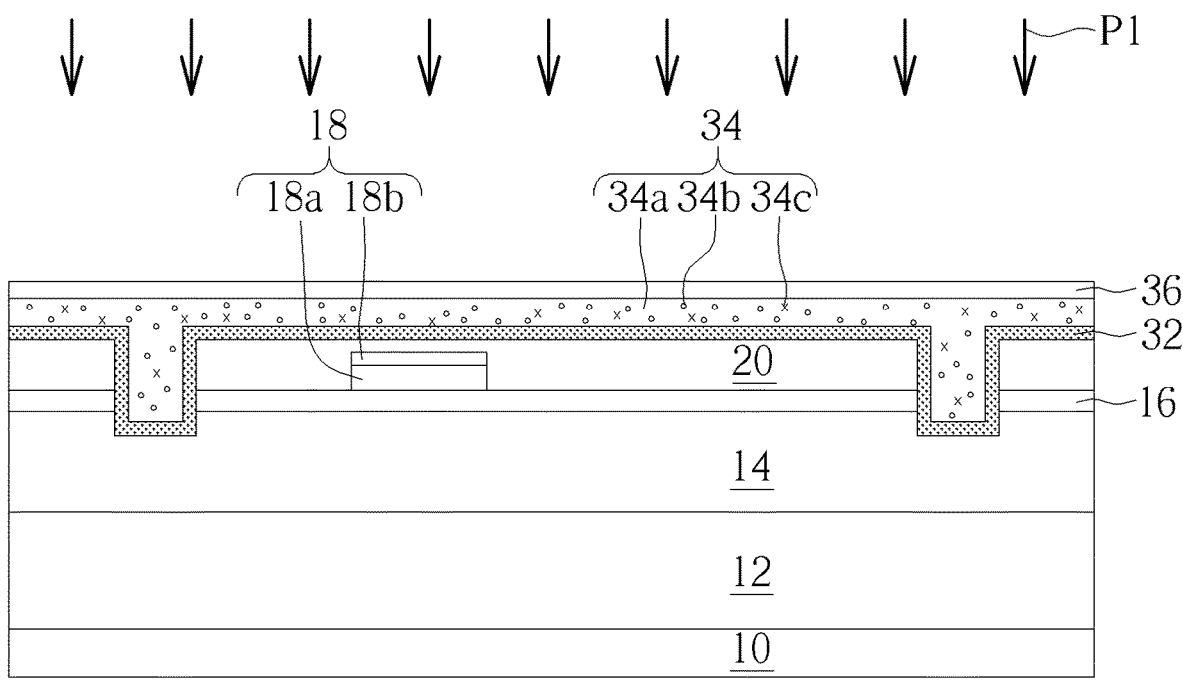
Figure 7:
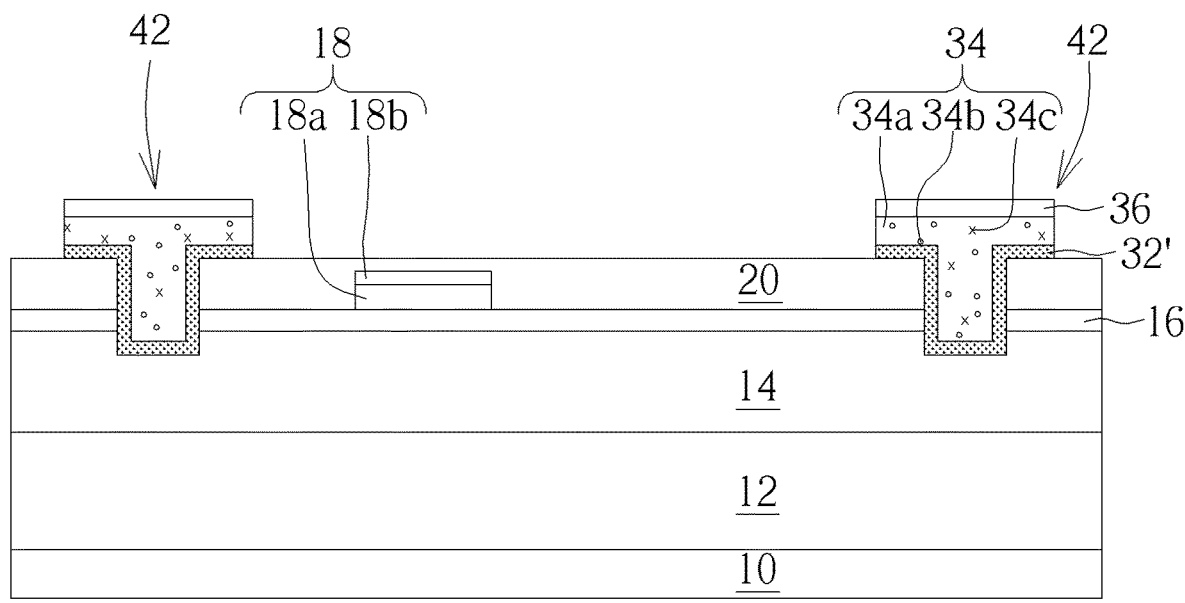
Figure 8:
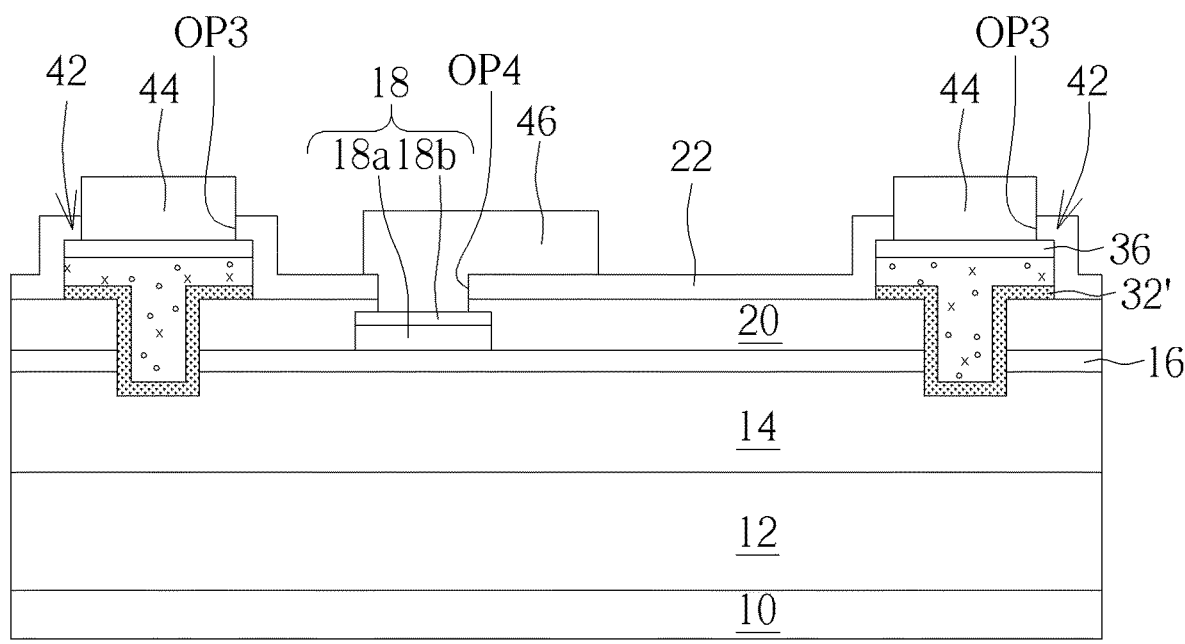

FIG. 5 to FIG. 8 are schematic cross-sectional views illustrating a method for forming a high electron mobility transistor according to another embodiment of the present invention. A difference between this embodiment and the embodiment shown in FIG. 1 to FIG. 4 is that the source/drain contacts and the gate contact of this embodiment are formed at different steps wherein the gate contact is formed after forming the source/drain contacts. In detail, as shown in FIG. 5, after forming the stack structure on the substrate 10, an etching process may be performed to etch the stack structure to form the openings OP1 in the stack structure at two si des of the gate structure 18 while no opening is formed and expose any portion of the gate structure 18. Following, a series of deposition processes or suitable film forming processes may be performed to sequentially form the liner 32, the metal layer 34 and the cap layer 36 on the stack structure and filling the openings OP1. Subsequently, as shown in FIG. 6, an anneal process P1 is performed to react the material of the channel layer 14 with the material of the liner 32, thereby forming an ohmic contact between the metal layer 34 and the channel layer 14 at the bottom portion of each of the openings OP1, and converting the liner 32 into a metal compound layer 32'. After that, as shown in FIG. 7, a patterning process may be performed to remove the unnecessary portions of the cap layer 36, the metal layer 34, and the metal compound layer 32', thereby forming contact structures 42 (source/drain contacts) respectively at two sides of the gate structure 18 and directly contacting the channel layer 14. Afterward, as shown in FIG. 8, a deposition may be performed to form another passivation layer 22 on the passivation layer 20 and covering the contact structures 42. The passivation layer 22 may include a dielectric material that may be referred to the materials suitable for the passivation layer 20. According to an embodiment of the present, the passivation layer 22 and the passivation layer 20 may include a same dielectric material, such as silicon nitride (SiN). An etching process may be performed to each the passivation layer 22 to form the openings OP3 and OP4 in the passivation layer 22, wherein the openings OP3 penetrate through the passivation layer 22 directly on the contact structures 42 and expose portions of the contact structures 42, and the opening OP4 penetrates through the passivation layer 22 and the passivation layer 20 directly on the gate structure 18 and exposes a portion of the metal gate layer 18b of the gate structure 18. Following, a deposition process or any suitable film forming process may be performed to form a metal layer (not shown) on the passivation layer 22 and filling the openings OP3 and OP4, and a patterning process may be performed to remove the unnecessary portions of the metal layer thereby forming contact structures 44 on the contact structures 42 and in direct contact with the contact structures 42 and a contact structure 46 (gate contact) on the gate structure 18 and in direct contact with the metal gate layer 18b of the gate structure 18. The contact structures 44 and the contact structure 46 may include a metal material, such as gold (Au), tungsten (W), cobalt (Co), nickel (Ni), titanium (Ti), molybdenum (Mo), copper (Cu), aluminum (Al), tantalum (Ta), palladium (Pd), platinum (Pt), compounds of the above materials, a composite layer of the above materials, or an alloy of the above materials, but is not limited thereto.

Figure 9:
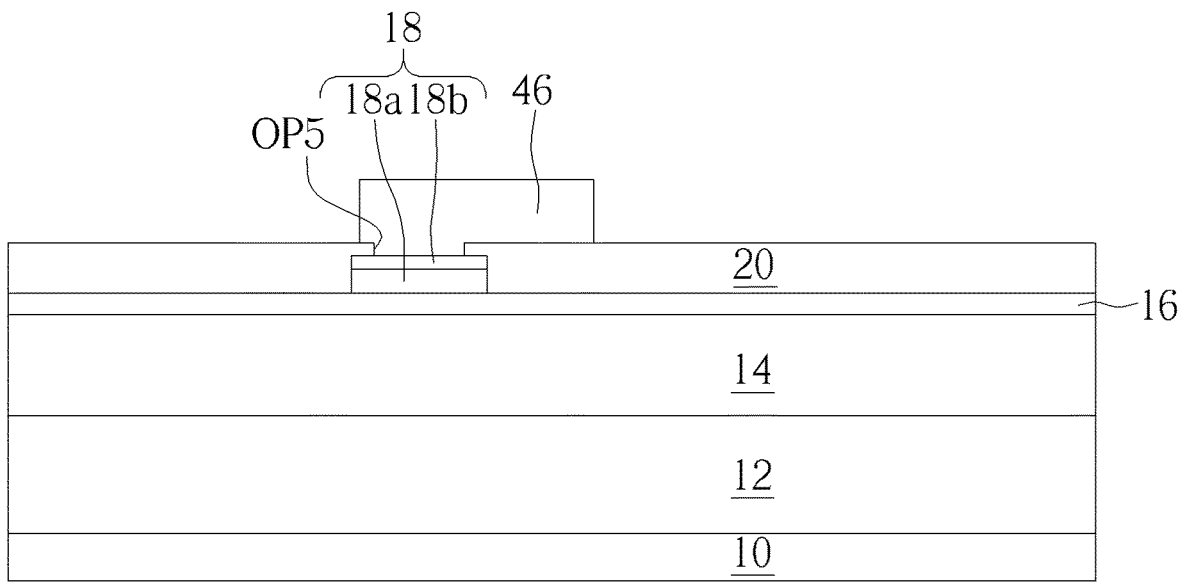
FIG. 9 to FIG. 12 are schematic cross-sectional views illustrating a method for forming a high electron mobility transistor according to still another embodiment of the present invention.
Figure 10:
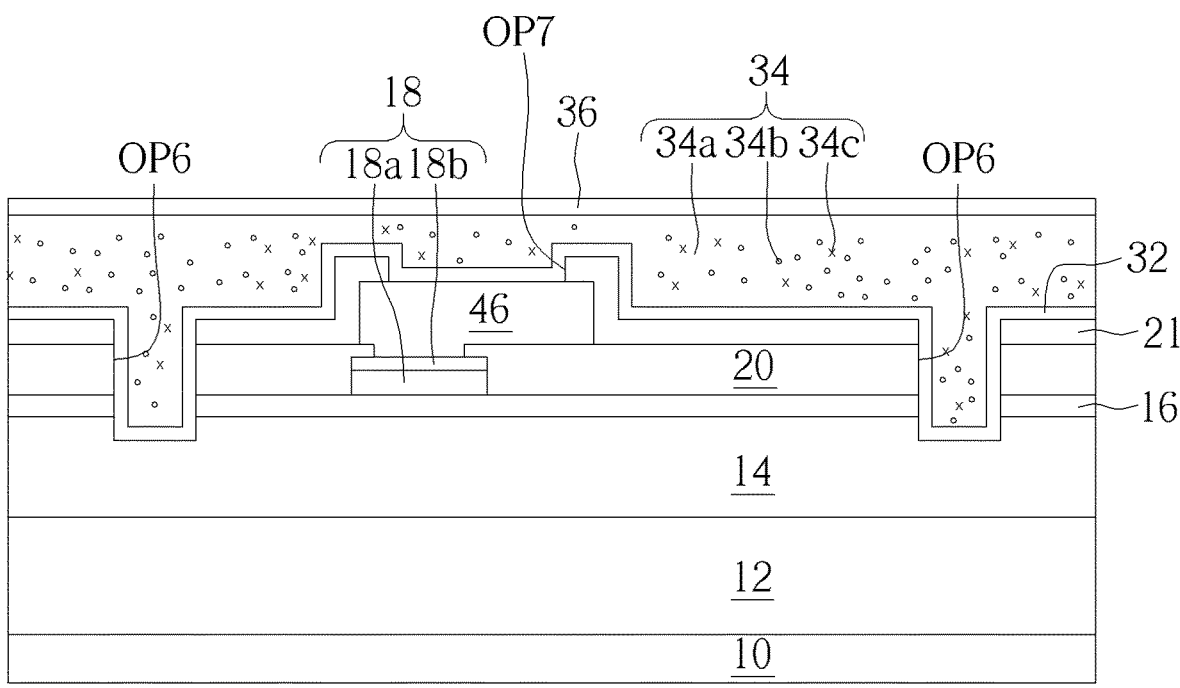
Figure 11:
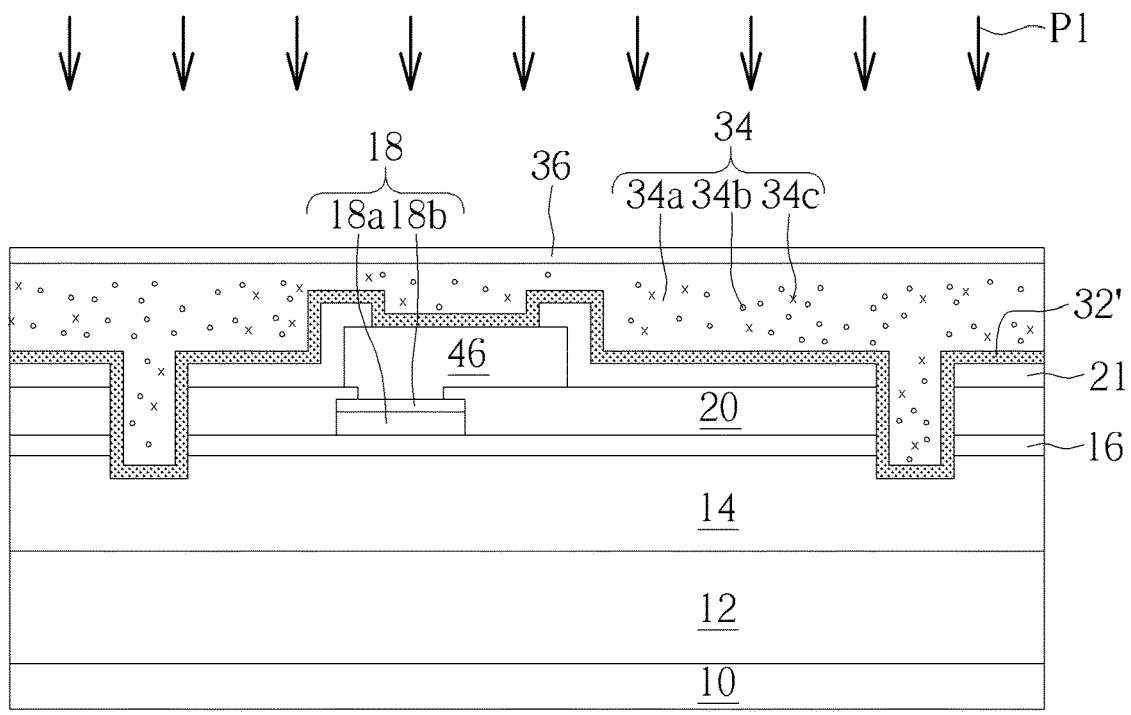
Figure 12:
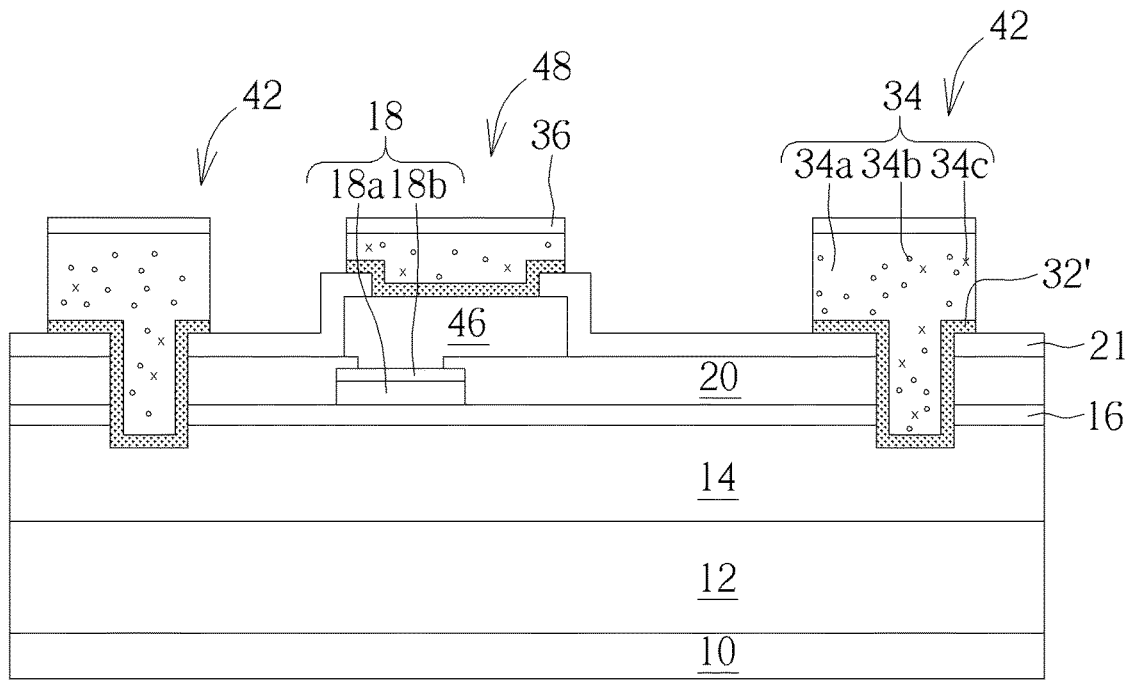

FIG. 9 to FIG. 12 are schematic cross-sectional views illustrating a method for forming a high electron mobility transistor according to still another embodiment of the present invention. A difference between this embodiment and the embodiment shown in FIG. 1 to FIG. 4 is that the source/drain contacts and the gate contact of this embodiment are formed at different steps, wherein the gate contact is formed before forming the source/drain contacts. In detail, as shown in FIG. 9, after forming the stack structure on the substrate 10, an etching process may be performed to etch the passivation layer 20 of the stack structure to form an opening OP5 that is directly on the gate structure 18 and exposing a portion of the metal gate layer 18b of the gate structure 18. Following, a deposition process or any suitable film forming process may be performed to form a metal layer (not shown) on the passivation layer 20 and filling the opening OP5, and a patterning process may be performed to remove the unnecessary portions of the metal layer thereby forming a contact structure 46 on the gate structure 18 and in in direct contact with the metal gate layer 18b of the gate structure 18. Subsequently, as shown in FIG. 10, a deposition may be performed to form another passivation layer 21 on the passivation layer 20 and covering the contact structure 46. The passivation layer 21 may include a dielectric material that may be referred to the materials suitable for the passivation layer 20. According to an embodiment of the present, the passivation layer 21 and the passivation layer 20 may include a same dielectric material, such as silicon nitride (SiN). Following, an etching process may be performed to each the passivation layer 21 and the passivation layer 20, thereby forming openings OP6 at two sides of the gate structure 18 and the opening OP7 directly on the contact structure 46. The openings OP6 respectively extend through the passivation layer 21, the passivation layer 20 and the barrier layer 16 to expose a portion of the channel layer 14. The opening OP7 extends through the passivation layer 21 directly on the contact structure 46 and exposes a portion of the contact structure 46. Subsequently, a series of deposition processes or suitable film forming processes may be performed to sequentially form the liner 32, the metal layer 34 and the cap layer 36 on the passivation layer 21 and filling the openings OP6 and OP7. Following, as shown in FIG. 11, an anneal process P1 is performed to react the material of the channel layer 14 with the material of the liner 32, thereby forming an ohmic contact between the metal layer 34 and the channel layer 14 at the bottom portion of each of the openings OP6, and converting the liner 32 into a metal compound layer 32'. Afterward, as shown in FIG. 12, a patterning process may be performed to remove the unnecessary portions of the cap layer 36, the metal layer 34, and the metal compound layer 32', thereby forming contact structures 42 (source/drain contacts) respectively at two sides of the gate structure 18 and directly contacting the channel layer 14 and a contact structure 48 directly on the contact structure 46.

In summary, the high electron mobility transistor provided by the present invention may achieve a lower source/drain contact resistance by forming the source/drain contact structure with a liner and a metal layer including at least a kind of additive. During the anneal process, the additive may diffuse to the interface between the metal layer and the liner and reduce the reaction of the metal layer and the liner, so that an ohmic contact with a lower resistance may be formed between the contact structure and the channel layer. Furthermore, the metal compound layer formed from reaction of the liner and the additive may serve as a diffusion barrier to prevent the gallium (Ga) of the channel layer from diffusing into the channel layer, and defects caused by the Ga-vacancies in the channel layer may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A high electron mobility transistor, comprising:
a channel layer disposed on a substrate;
a barrier layer disposed on the channel layer;
a passivation layer disposed on the barrier layer; and
a contact structure disposed on the passivation layer and
   extending through the passivation layer and the barrier layer to directly contact the channel layer, wherein the contact structure comprises:
- a liner; and
- a metal layer directly disposed on the liner, wherein the metal layer comprises a metal material doped throughout with a first additive and a second additive, and a weight percentage of the first additive in the metal layer is between 0% and 2%, a weight percentage of the second additive in the metal layer is between 0% and 1%.

2. The high electron mobility transistor according to claim 1, wherein the liner is in direct contact with the channel layer, the barrier layer and the passivation layer.

3. The high electron mobility transistor according to claim 1, wherein the liner comprises titanium (Ti) and the metal material comprises aluminum (Al).

4. The high electron mobility transistor according to claim 1, wherein the first additive comprises at least one of silicon (Si), germanium (Ge) and carbon (C).

5. The high electron mobility transistor according to claim 1, wherein the second additive comprises copper (Cu).

6. The high electron mobility transistor according to claim 1, wherein the metal layer is separated from the passivation layer, the barrier layer and the channel layer by the liner.

7. The high electron mobility transistor according to claim 1, wherein the liner comprises at least one of titanium silicide (TiSi), titanium germanium (TiGe), and titanium carbide (TiC).

8. The high electron mobility transistor according to claim 7, wherein the liner further comprises titanium nitride (TiN).

9. The high electron mobility transistor according to claim 1, wherein the channel layer comprises gallium nitride (GaN), the barrier layer comprises aluminum gallium nitride (AlGaN), and the passivation layer comprises silicon nitride (SiN).

10. A method for forming a high electron mobility transistor, comprising:
- forming a channel layer on a substrate;
- forming a barrier layer on the channel layer;
- forming a passivation layer on the barrier layer;
- forming an opening through the passivation and the barrier layer to expose a portion of the channel layer;
- forming a liner along a bottom surface and sidewalls of the opening; and
- forming a metal layer directly on the liner, wherein the metal layer comprises a metal material doped throughout with a first additive and a second additive, and a weight percentage of the first additive in the metal layer is between 0% and 2%, a weight percentage of the second additive in the metal layer is between 0% and 1%.

11. The method for forming a high electron mobility transistor according to claim 10, further comprising:
- performing an anneal process, wherein the liner reacts with the first additive to form a metal compound layer during the anneal process.

12. The method for forming a high electron mobility transistor according to claim 11, wherein the metal compound layer comprises at least one of titanium silicide (TiSi), titanium germanium (TiGe), and titanium carbide (TIC).

13. The method for forming a high electron mobility transistor according to claim 12, wherein the metal compound layer further comprises titanium nitride (TN).

14. The method for forming a high electron mobility transistor according to claim 12, wherein the anneal process is performed at a temperature between 450° C. and 900° C.

15. The method for forming a high electron mobility transistor according to claim 11, wherein the metal material comprises aluminum (Al), and the first additive comprises at least one of silicon (Si), germanium (Ge) and carbon (C).

16. The method for forming a high electron mobility transistor according to claim 1, wherein the second additive comprises copper (Cu).

17. The method for forming a high electron mobility transistor according to claim 11, wherein the liner is in direct contact with the channel layer, the barrier layer and the passivation layer.

18. The method for forming a high electron mobility transistor according to claim 11, wherein the channel layer comprises gallium nitride (GaN), the barrier layer comprises aluminum gallium nitride (AlGaN), and the passivation layer comprises silicon nitride (SiN).

* * * * *